(12) United States Patent
Minoda

(10) Patent No.: US 9,589,940 B2
(45) Date of Patent: Mar. 7, 2017

(54) LIGHT EMITTING DEVICE

(71) Applicant: NICHIA CORPORATION, Anan-shi (JP)

(72) Inventor: Yohei Minoda, Yokohama (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/724,861

(22) Filed: May 29, 2015

(65) Prior Publication Data

US 2016/0133611 A1    May 12, 2016

(30) Foreign Application Priority Data

Nov. 7, 2014   (JP) .................................. 2014-227589
Jan. 13, 2015  (JP) .................................. 2015-004069

(51) Int. Cl.
*H01L 33/00*   (2010.01)
*H01L 33/48*   (2010.01)
(Continued)

(52) U.S. Cl.
CPC ........ *H01L 25/0753* (2013.01); *H01L 27/153* (2013.01); *F21K 9/00* (2013.01); *F21Y 2101/00* (2013.01); *F21Y 2103/10* (2016.08); *F21Y 2107/40* (2016.08); *F21Y 2115/10* (2016.08); *H01L 27/156* (2013.01); *H01L 33/62* (2013.01); *H01L 2224/48091* (2013.01); *H01L 2224/48465* (2013.01); *H01L 2924/0002* (2013.01)

(58) Field of Classification Search
CPC ....... H01L 25/0753; H01L 2224/48091; H01L 2224/48227; H01L 2224/73265; H01L 33/62; H01L 27/153
See application file for complete search history.

(56) References Cited

U.S. PATENT DOCUMENTS 7,902,568 B2 * 3/2011 Morikawa ................ F21K 9/00
                                                  257/100
2005/0156187 A1   7/2005 Isokawa et al.
(Continued)

FOREIGN PATENT DOCUMENTS

JP    2003-264267    9/2003
JP    2009-81195     4/2009
(Continued)

*Primary Examiner* — Victor A Mandala
*Assistant Examiner* — Regan J Rundio
(74) *Attorney, Agent, or Firm* — Mori & Ward, LLP

(57) ABSTRACT

A light emitting device includes a substrate, a first light emitting element, a second light emitting element, a first conductive pattern, and a second conductive pattern. The first conductive pattern is provided on the substrate and includes a first element mounting portion and a first wire connecting portion. The second conductive pattern is provided on the substrate to form a first wiring gap between the first conductive pattern and the second conductive pattern. A first recess is provided between the first element mounting portion and the first wire connecting portion and is in communication with the first wiring gap. At least a part of an outer shape of the first element mounting portion is defined by the first wiring gap and the first recess on a third side of the first element mounting portion adjacent to the second conductive pattern.

15 Claims, 5 Drawing Sheets

(51) Int. Cl.
  *H01L 25/075* (2006.01)
  *H01L 27/15* (2006.01)
  *H01L 33/62* (2010.01)
  *F21K 99/00* (2016.01)
  *F21Y 101/00* (2016.01)

(56) References Cited

U.S. PATENT DOCUMENTS

2010/0176751 A1    7/2010    Oshio et al.
2011/0133217 A1*    6/2011    Hakamata ............ F21S 48/1109
                                                                257/88
2012/0007076 A1*    1/2012    Cho ....................... F21S 48/115
                                                                257/48

FOREIGN PATENT DOCUMENTS

JP          2010-526425      7/2010
JP          2011-216514      10/2011

* cited by examiner

LIGHT EMITTING DEVICE

CROSS-REFERENCE TO RELATED APPLICATIONS

The present application claims priority under 35 U.S.C. §119 to Japanese Patent Application No. 2014-227589, filed Nov. 7, 2014 and Japanese Patent Application No. 2015-004069, filed Jan. 13, 2015. The contents of these applications are incorporated herein by reference in their entirety.

BACKGROUND

Technical Field

The present disclosure relates to a light emitting device.

Discussion of the Background

Light emitting diodes (hereinafter abbreviated as "LEDs") have been used as various light sources for a lighting device as well as an optical communication device from the viewpoints of their high light emitting efficiency, low power consumption, and long lifetime. In particular, a light emitting device having a plurality of light emitting elements arrayed on a substrate has been used in a printer, a scanner, or a composite machine including them.

In addition, a light emitting device for linearly emitting desired light such as ultraviolet light or visible light has been used in many fields of a scanner, ink, resin hardening, panel sticking, and the like.

The plurality of light emitting elements arrayed on a substrate have been used as a light source of ultraviolet light or visible light.

A light emitting element for use in the above-described light emitting device has a structure in which, for example, p-type and n-type semiconductor layers are epitaxially grown, and thereafter, p-electrodes and n-electrodes that include conductors are bonded to the corresponding semiconductor layers. In a light emitting element of a so-called vertical structure, an n-electrode (i.e., a cathode) is disposed on a light extracting surface side of the light emitting element whereas a p-electrode (i.e., an anode) is disposed on a reverse surface side opposite to the light extracting surface side. Die bonding is performed such that the p-electrode at the reverse surface of the light emitting element is bonded to a conductive pattern formed on the substrate via soldering or conductive paste. And then, the n-electrode on the light extracting surface side is subjected to wire bonding between a bonding region of the substrate and the same, so that the light emitting element and the substrate are electrically connected to each other.

As the above-described LED light emitting device having the plurality of light emitting elements arrayed on the substrate has been proposed, for example, an LED device including: a substrate having a first edge and a second edge that is faced to the first edge and parallel to the first edge, and a conductive pattern provided on an upper surface of the substrate, the conductive pattern having a first bonding area which lies on a first edge side of the substrate and a second bonding area which lies on a second edge side of the substrate; an LED chip having a first edge and a second edge that is faced to the first edge and parallel to the first edge, and having a first pad electrode which lies on a first edge side of the LED chip, and a second pad electrode which lies on a second edge side of the LED chip, the first and second pad electrodes being provided on two diagonal corners of an upper surface of the LED chip, the LED chip being mounted on the substrate so that the first edge of the LED chip and the first edge of the substrate become parallel to each other at intervals and the second edge of the LED chip and the second edge of the substrate become parallel to each other at intervals; a first wire installed between the first pad electrode and the first bonding area; and a second wire installed between the second electrode and the second bonding area; wherein an installing direction of the first wire from the first pad electrode, as viewed from thereabove, constitutes a direction which is inclined at 15 to 40 degrees towards an orientation which moves away from the first edge of the LED chip with respect to a moving-away direction that is orthogonal to the first edge of the LED chip and toward the first edge of the substrate from the first edge of the LED chip; and wherein an installing direction of the second wire from the second pad electrode, as viewed from thereabove, constitutes a direction which is inclined at 15 to 40 degrees towards an orientation which approaches the second edge of the LED chip with respect to a second orthogonal moving-away direction that is orthogonal to the second edge of the LED chip and toward the second edge of the substrate from the second edge of the LED chip. (Japanese Unexamined Patent Application Publication No. 2011-216514).

SUMMARY OF THE INVENTION

According to one aspect of the present invention, a light emitting device includes a substrate, a first light emitting element, a second light emitting element, a first conductive pattern, and a second conductive pattern. The first light emitting element is provided on the substrate. The second light emitting element is provided on the substrate adjacent to the first light emitting element. The first conductive pattern is provided on the substrate and includes a first element mounting portion and a first wire connecting portion. The first light emitting element is mounted on the first element mounting portion. A wire connected to the second light emitting element is connected to the first wire connecting portion. The first wire connecting portion is provided on a first side of the first element mounting portion and a second side of the first element mounting portion opposite to the first side. The second conductive pattern is provided on the substrate to form a first wiring gap between the first conductive pattern and the second conductive pattern. The second conductive pattern includes a second element mounting portion on which the second light emitting element is mounted. A first recess is provided between the first element mounting portion and the first wire connecting portion and is in communication with the first wiring gap. The first recess is provided on the first side of the first element mounting portion and the second side of the first element mounting portion. At least a part of an outer shape of the first element mounting portion is defined by the first wiring gap and the first recess on a third side of the first element mounting portion adjacent to the second conductive pattern. The first wire connecting portion projects toward the second conductive pattern beyond an edge of the first element mounting portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
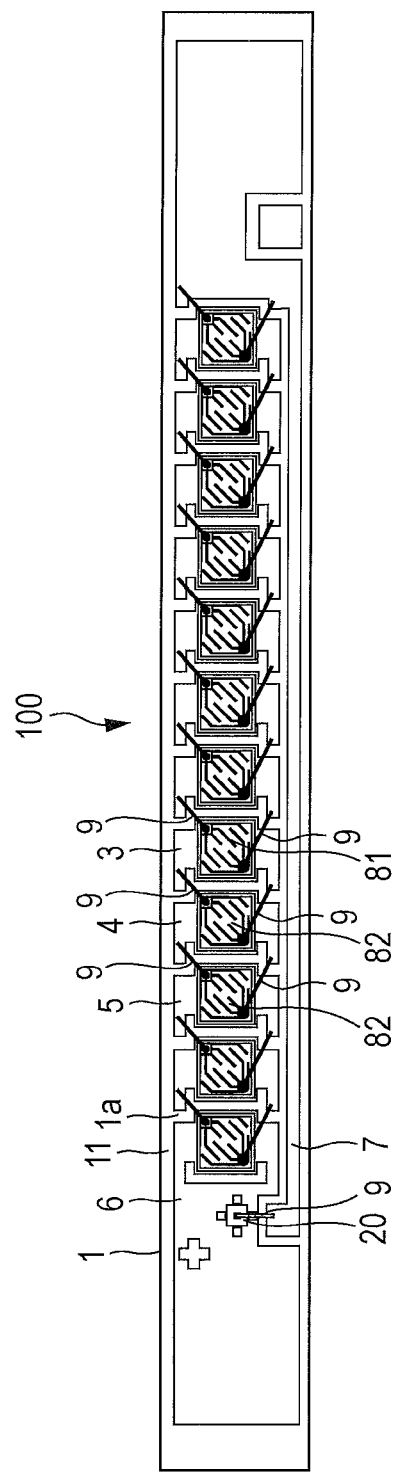
FIG. 1 is a top view schematically showing a light emitting device according to one embodiment of the present invention.

The embodiments will now be described with reference to the accompanying drawings, wherein like reference numerals designate corresponding or identical elements throughout the various drawings.

Hereinafter, light emitting devices according to embodiments of the present invention will be described with reference to the attached drawings.

First Embodiment

Figure 2:
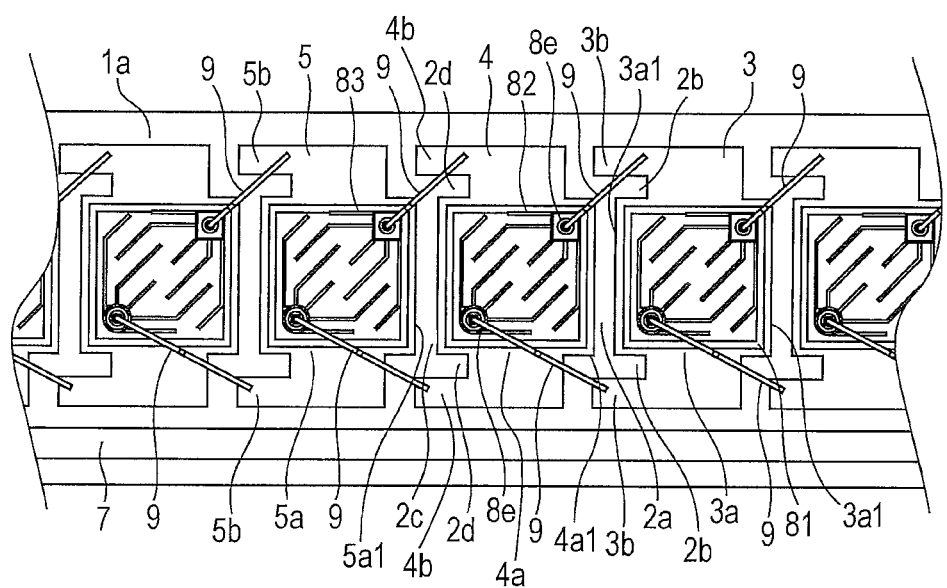
FIG. 2 is an enlarged top view schematically showing the light emitting device shown in FIG. 1.

FIG. 1 is a top view showing a light emitting device in a first embodiment of the present invention; and FIG. 2 is an enlarged top view showing the light emitting device.

The light emitting device shown in FIG. 1 includes: a first light emitting element 81; a second light emitting element 82 disposed adjacent to the first light emitting element 81; a first conductive pattern 3 including a first element mounting portion 3a that is formed on a substrate 1 and has the first light emitting element 81 mounted thereon and a first wire connecting portion 3b connected to a wire 9 to be connected to the second light emitting element 82;
and a second conductive pattern 4 including a second element mounting portion 4a that is separated from the first conductive pattern 3 while holding a first wiring gap 2a therebetween and mounts the second light emitting element 82 thereon. The outer shape of the first element mounting portion 3a is defined by the first wiring gap 2a and a first recess 2b that is formed between the first element mounting portion 3a and the first wire connecting portion 3b, is continuous to the first wiring gap 2a, and is formed on each of both sides of the first element mounting portion 3a on a side near the second conductive pattern 4. The first wire connecting portion 3b extends toward the second conductive pattern 4 beyond the first element mounting portion 3a.

Specifically, twelve light emitting elements including the first light emitting element 81 and the second light emitting element 82, in which each of the light emitting elements is formed into a substantially rectangular shape, as viewed on a top, are mounted in an array on the substrate 1 having a base member 11 and a plurality of conductive patterns including the first conductive pattern 3, the second conductive pattern 4, and a third conductive pattern 5. More specifically, the first light emitting element 81 is mounted on the first conductive pattern 3, and further, the second light emitting element 82 is mounted on the second conductive pattern 4. Moreover, the second light emitting element 82, more particularly, two n-electrodes 8e of the second light emitting element 82 and the first conductive pattern 3 are connected to each other via the two conductive wires 9, respectively.

As shown in FIGS. 1 and 2, the first conductive pattern 3 in the present embodiment has the first element mounting portion 3a and the two first wire connecting portions 3b (one of the first wire connecting portions 3b is referred to as a "first sub-connecting portion", and the other of the first wire connecting portions 3b is referred to as a "second sub-connecting portion") disposed on both sides of the first element mounting portion 3a. Moreover, the second conductive pattern 4 has the second element mounting portion 4a and two second wire connecting portions 4b (one of the second wire connecting portions 4b is referred to as a "third sub-connecting portion", and the other of the second wire connecting portions 4b is referred to as a "fourth sub-connecting portion") disposed on both sides of the second element mounting portion 4a, and further, the second conductive pattern 4 has substantially the same shape as that of the first conductive pattern 3.

The substrate 1 includes the base member 11 made of a plate-like material having an insulating property such as a glass epoxy resin or ceramic including alumina. On the base member 11, the plurality of conductive patterns including the first conductive pattern 3, the second conductive pattern 4, and the third conductive pattern 5, electrode patterns 6 and 7, and the like are formed of a conductive material such as copper by an electrolytic plating or etching, etc. In the present embodiment, aluminum nitride having high heat dissipation performance may be used as the base member 11, and further, a gold thin film formed on a copper base member may be used as the conductive pattern.

The first conductive pattern 3 and the second conductive pattern 4 are insulated and separated from each other via an insulating region 1a. Here, the insulating region signifies a region in which no conductor is formed on the substrate 1, and further, a non-wettable region which has no wettability with respect to a bonding member, described later, or has wettability lower than that of the conductive pattern or the electrode pattern. In FIGS. 1 and 2, the electrode pattern 6 serves as an anode electrode (i.e., an anode) of a light emitting device 100 whereas the electrode pattern 7 serves as a cathode electrode (i.e., a cathode). These electrode patterns 6 and 7 are insulated from each other via the insulating regions, and the first and second conductive patterns 3 and 4, and the like also are insulated from each other via the insulating regions. Here, one light emitting element is mounted on the electrode pattern 6 of the anode, and further, the electrodes (upper electrodes) on the light emitting element is connected to the conductive pattern adjacent to the electrode pattern 6 via two wires. In addition, a protective element 20 is mounted on the electrode pattern 6 of the anode. To the electrode pattern 7 of the cathode is connected a wire connected to the upper surface of the protective element 20. Incidentally, the light emitting device in the present embodiment may have a conductive pattern, on which no light emitting element is mounted or to which no wire is connected.

As shown in FIG. 2, the insulating region 1a in the present embodiment includes at least the first wiring gap 2a and the first recess portion 2b.

The first wiring gap 2a is interposed between the first conductive pattern 3 and the second conductive pattern 4. In other words, the second conductive pattern 4 is separated from the first conductive pattern 3 while holding the first wiring gap 2a therebetween.

Moreover, the first recess 2*b* of the first conductive pattern 3 is continuous to the first wiring gap 2*a* on a side of the first conductive pattern 3 near the second conductive pattern 4, and further, is disposed between the two first wire connecting portions 3*b* on both sides of the first element mounting portion 3*a*. In other words, the first recess 2*b* allows a portion of the first conductive pattern 3, specifically, a portion of the first wire connecting portion 3*b* connected to the first element mounting portion 3*a* to have a narrow width.

The first wiring gap 2*a* and the two first recesses 2*b* (one of the first recesses 2*b* is referred to as a "first sub-recess", and the other of the first recesses 2*b* is referred to as a "second sub-recess") define at least a part of the outer shape of the first element mounting portion 3*a*.

In the present embodiment, the first light emitting element 81 and the second light emitting element 82 are disposed adjacent to each other. Specifically, they are disposed such that one side of the square first light emitting element 81, as viewed from above, and one side of the square second light emitting element 82, as viewed from above, are substantially parallel to each other.

The first conductive pattern 3 in the first embodiment has the first element mounting portion 3*a* that mounts the first light emitting element 81 thereon and the two first wire connecting portions 3*b* disposed on both sides of the first element mounting portion 3*a*, respectively, as shown in FIG. 2. The recess 2*b* is interposed between the first element mounting portion 3*a* and each of the two first wire connecting portions 3*b*. An end of each of the two first wire connecting portions 3*b* extends toward the second conductive pattern 4 beyond the first element mounting portion 3*a*.

More specifically, the first element mounting portion 3*a* is disposed on the substrate 1 with a shape corresponding to the four sides of the p-electrode 8*f* to match, for example, the shape of the square p-electrode 8*f* serving as a lower electrode of the first light emitting element 81.

Furthermore, the first element mounting portion 3*a* in the present embodiment has two projecting portions 3*a*1. Specifically, one of the two first recesses 2*b* allows the first element mounting portion 3*a* to have a shape projecting toward the first wiring gap 2*a*. Another one of the two projecting portions 3*a*1 projects toward a side opposite to the second conductive pattern 4. With these projecting portions 3*a*1, the first light emitting element 81 can be precisely positioned. Therefore, it is possible to more precisely position the first light emitting element 81.

As described above, the first conductive pattern 3 is provided with the two first wire connecting portions 3*b* and 3*b*. The recess 2*b* where the insulating base member 11 exposes between the first element mounting portion 3*a* and the first wire connecting portion 3*b*.

Each of the first wire connecting portions 3*b* extends toward the second conductive pattern 4 having the second light emitting element 82 mounted thereon.

The first wire connecting portions 3*b* and 3*b* of the first conductive pattern 3 and the n-electrodes of the second light emitting element 82 mounted on the adjacent second conductive pattern 4 are connected via the two wires 9, respectively. As shown in FIGS. 1 and 2, the wires 9 are bonded to the respective ends of the wire connecting portions 3*b* and 3*b* extending toward the second conductive pattern 4.

The second conductive pattern 4 in the present embodiment has the second element mounting portion 4*a* and the second wire connecting portion 4*b*, similarly to the first conductive pattern 3. The second element mounting portion 4*a* includes a projecting portion 4*a*1 projecting toward the first conductive pattern 3 beyond an edge of the second wire connecting portion 4*b*. Therefore, it is possible to enhance the positioning accuracy of the second light emitting element 82 while narrowing an interval between the first light emitting element 81 and the second light emitting element 82.

In the present embodiment, the other conductive patterns including the third conductive pattern 5 also are formed on the substrate 1 with configurations similar to those of the first conductive pattern 3 and the second conductive pattern 4. In addition, other light emitting elements and wires connected thereto have similar configurations. That is, in the present embodiment, the plurality of conductive patterns and the twelve light emitting elements are configured so that configuration of the first conductive pattern 3 and the second conductive pattern 4 is repeated.

As shown in FIG. 2, the light emitting device 100 in the present embodiment includes the third conductive pattern 5 on a side opposite to the first wiring gap 2*a* with respect to the second conductive pattern 4. The third conductive pattern 5, on which the third light emitting element 83 is mounted, is apart from the second conductive pattern 4 with the second wiring gap 2*c* therebetween. In this case, as shown in FIG. 2, it is preferable that the second conductive pattern 4 is provided, on a side near the third conductive pattern 5, with the second wiring gap 2*c* and second recesses 2*d* (one of the second recesses 2*d* is referred to as a "third sub-recess", and the other of the second recesses 2*d* is referred to as a "fourth sub-recess"). The second recesses 2*d* are formed between the second element mounting portion 4*a* and the second wire connecting portion 4*b* and formed on both sides of the second element mounting portion 4*a* continuously to the second wiring gap 2*c*, like the first conductive pattern 3. Furthermore, it is preferable that the third conductive pattern 5 also has a projecting portion 5*a*1 projecting toward the second conductive pattern 4 in the same manner. Consequently, it is possible to enhance the positioning accuracy of the third light emitting element 83 while narrowing an interval between the second light emitting element 82 and the third light emitting element 83. In the present embodiment, the third conductive pattern 5 has a third element mounting portion 5*a* and two wire connecting portions 5*b*, similarly to the first conductive pattern 3 and the second conductive pattern 4.

In the present embodiment, the formation of the recess and the like can enhance the positioning accuracy of the light emitting element during the light emitting element is mounted on the element mounting portion.

In the case where the first light emitting element 81 is mounted on the first element mounting portion 3*a* by reflow or the like, when a bonding member (such as soldering paste) previously applied on and around the first element mounting portion 3*a* is brought into contact with a lower electrode of the first light emitting element 81, a part of the bonding member collects onto the first element mounting portion 3*a* having a good wettability at the time of fusing in such a manner as to avoid the first recess 2*b* and the first wiring gap 2*a* which are non-wet regions. In this manner, the first wiring gap 2*a* and the recesses 2*b* on both sides of the first element mounting portion 3*a* determine the positions of two corners near the second conductive pattern 4 of the light emitting element 81. Furthermore, the projecting portion 3*a*1 of the first element mounting portion 3*a* determines the positions of the other two corners of the light emitting element 81, thus enhancing the accuracy of the position where the first light emitting element 81 is mounted.

Although the description has been given by way of the first conductive pattern 3 and the first light emitting element 81, the same goes for the second conductive pattern 4 and the second light emitting element 82 or the other conductive patterns and the light emitting elements mounted thereon in the present embodiment.

Figure 3:
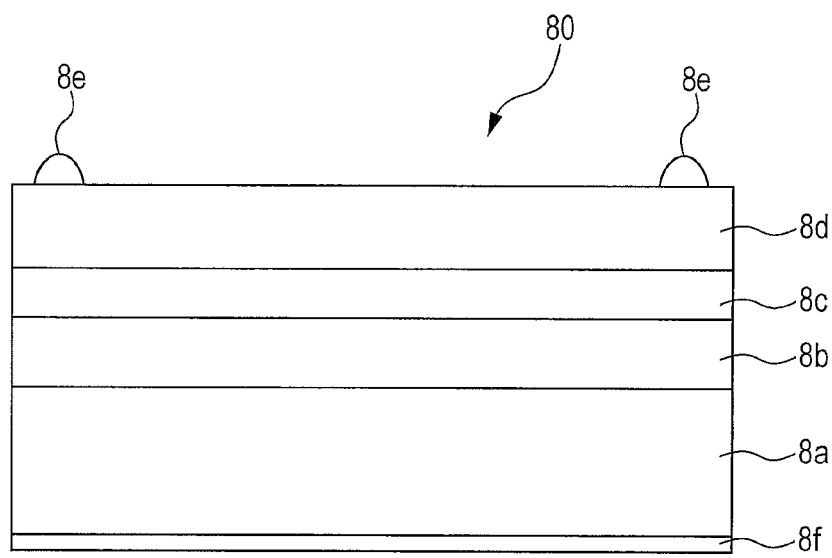
FIG. 3 is a schematic view showing the cross-sectional structure of a light emitting element provided in the light emitting device shown in FIG. 1.

FIG. 3 schematically shows one example of a cross-sectional structure of the light emitting element 80, which is applicable to the present embodiment. The light emitting element 80 is made of, for example, a GaN-based blue LED of a nitride-based compound semiconductor (general formula: $In_xAl_yGa_{1-x-y}N$ ($0 \leq x$, $0 \leq y$, $x+y \leq 1$)). Moreover, the light emitting element 8 may be made of, for example, other ZnSe-based, InGaAs-based, and AlInGaP-based compound semiconductors.

The light emitting device in the present embodiment may preferably use a light emitting element having a light emitting wavelength of an ultraviolet region, for example, 400 nm or less. The light emitting device having the above-described ultraviolet light emitting elements arrayed thereon is used for hardening printing ink or resin. With respect to these uses, it is sometimes necessary to make the light emitting intensity of a linear light emitting portion as uniform as possible. In the light emitting device in the present embodiment, the accuracy of the mounting position of the light emitting element can be enhanced, and further, the interval between the light emitting elements can be narrowed, and consequently, the uniformity of the light emitting intensity of the light emitting device for the ultraviolet light emission can be enhanced.

The light emitting element 80 can be obtained such that an n-type semiconductor layer 8d, an active layer 8c, and a p-type semiconductor layer 8b are stacked in sequence on a growing substrate made of sapphire or the like by, for example, Metal Organic Chemical Vapor Deposition (abbreviated as MOCVD) method; a support substrate 8a is attached onto the p-type semiconductor layer side; the sapphire substrate is removed; and then, as viewed from the active layer, the n-electrode 8e is formed on the side of the n-type semiconductor layer, whereas a p-electrode 8f is formed on the side of the p-type semiconductor layer.

A light emitting element may be a type in which the growing substrate is used as a support substrate without removing the growing substrate made of sapphire or the like, and then, an n-electrode and a p-electrode are provided on the same surface.

In the present embodiment, the n-electrode 8e serving as an upper electrode of the light emitting element 80 is electrically connected to the n-type semiconductor layer 8d. As shown in FIGS. 1 and 2, the n-electrodes 8e in the present embodiment are disposed at two diagonal portions at an upper surface (i.e., a light extracting surface) of the square light emitting element 80. That is to say, the n-electrodes 8e and 8e at the two portions have the same polarity. In the meantime, the p-electrode 8f serving as a lower electrode is electrically connected to the support substrate 8a, and is disposed at the reverse surface (i.e., a bonding surface) of the light emitting element 80. The n-electrode 8e and the p-electrode 8f are formed by, for example, depositing a metal material such as Au that has a low electric resistance and is good in corrosion resistance.

The n-electrode 8e serving as the upper electrode should be preferably formed into a shape having a pad portion subjected to wire bonding and an auxiliary electrode portion that is continuous to the pad portion and has a width smaller than that of the pad portion. In addition, the p-electrode 8f serving as the lower electrode should be preferably formed over substantially the entire reverse surface of the light emitting element 80 so as to enhance the bonding force between the conductive pattern and the p-electrode 8f.

In the light emitting element 80, a forward current is supplied from the p-electrode 8f to the n-electrode 8e, so that carriers (i.e., holes and electrons) are moved to the active layer 8c, followed by confinement, in which the carriers are efficiently recombined, and thus light is emitted. For this reason, the active layer 8c is referred to also as a light emitting layer.

As shown in FIGS. 1 and 2, in the light emitting device in the present embodiment, at least one light emitting element, that is, the first light emitting element 81, the second light emitting element 82, and the third light emitting element 83 are mounted on the first conductive pattern 3, and the second conductive pattern 4, and the third conductive pattern 5, respectively, that are formed on the substrate 1 and are electrically insulated from each other in such a manner that one side of each of the squares becomes parallel to the other side with respect to a light emission line L. Here, the "light emission line" is defined as a virtual line connecting the centers of the plurality of light emitting elements (a plurality of light emitting elements to be mounted) 81, 82, and 83.

In the embodiment shown in FIGS. 1 and 2, the above-described two n-electrodes 8e and 8e serving as the upper electrodes having the same polarity are disposed at the diagonal positions at the upper surface (i.e., the light extracting surface) of each of the light emitting elements 81, 82, and 83.

The light emitting elements 81, 82, and 83 are arrayed on the substrate 1 in a direction in which the line connecting these two n-electrodes 8e and 8e crosses the light emission line. In particular, the light emitting elements 81, 82, and 83 are arrayed in a direction in which the line connecting these two n-electrodes 8e and 8e crosses at an angle of 45° with respect to the light emission line.

Since the two n-electrodes 8e and 8e are disposed at the corners of the light extracting surface of each of the light emitting elements 81, 82, and 83, the electrons flowing in the above-described n-type semiconductor layer 8d can be dispersed uniformly. Furthermore, the pad electrodes of the two n-electrodes 8e and 8e at one light emitting element are positioned in such a manner as not to overlap in a direction in which an object to be irradiated light from the light emitting device is moved and perpendicular to the light emission line, and therefore, a portion having a low light emission intensity can be dispersed in the case of using as a linear light source, so that the device can be favorably used as the light source for printing ink or resin hardening.

With the above-described light emitting device in the first embodiment, it is possible to enhance the mounting positioning accuracy of the light emitting element to be mounted on the conductive pattern. In addition, the element mounting portion of one of the conductive patterns projects toward the adjacent element mounting portion, thereby narrowing the interval between the light emitting elements to be mounted on the conductive patterns.

In particular, the insulating region 1a separating the first conductive pattern 3 and the second conductive pattern 4 that are adjacent to each other defines the outer shapes of the first element mounting portion 3a and the second element mounting portion 4a as the first wiring gap 2a, and therefore, the first conductive pattern 3 and the second conductive pattern 4, especially, the first element mounting portion 3a and the second element mounting portion 4a can be densely arranged, and further, the interval between the first light emitting element 81 and the second light emitting element 82 that are mounted on the element mounting portions 3a and 4a, respectively, can be narrowed.

Furthermore, the first wire connecting portions 3b are arranged on both sides of the first element mounting portion 3a, the first recess 2b is formed between the first wire connecting portion 3b and the first element mounting portion 3a, and the first recess 2b defines the outer shape of the first element mounting portion 3a.

Therefore, it is possible to enhance the positioning accuracy of the light emitting element 81 while reducing the space for disposing the light emitting element 81 at the upper surface of the light emitting device 100, and further, to narrow the interval between the first light emitting element 81 and the second light emitting element 82. Consequently, the light emitting device 100 can be miniaturized. Moreover, the first wire connecting portion 3b extends toward the second element mounting portion 4a, and further, the wire is connected to an end of the first wire connecting portion 3b, and therefore, the wire 9 can be shortened. Thus, it is possible to reduce a fear of breakage or fusion of the wire 9, so as to enhance the reliability of the light emitting device 100.

Furthermore, the recess 2b is formed between the first element mounting portion 3a and the end of the wire connecting portion 3b, to which the wire 9 is bonded, so that it is possible to reduce a possibility that the bonding member for bonding the first light emitting element 81 to the first element mounting portion 3a may extend to the portion at which the wire 9 is connected. Consequently, it is possible to enhance the bonding reliability of the wire 9 and the mass productivity of the light emitting device 100.

Although the description has been given by way of the first conductive pattern 3, the second conductive pattern 4, the first light emitting element 81, and the second light emitting element, the interrelationship among the second conductive pattern 4, the second light emitting element 82, the third conductive pattern 5, and the third light emitting element 83 is the same in the present embodiment. The same goes for the other conductive patterns and the light emitting elements to be mounted thereon.

Figure 4:
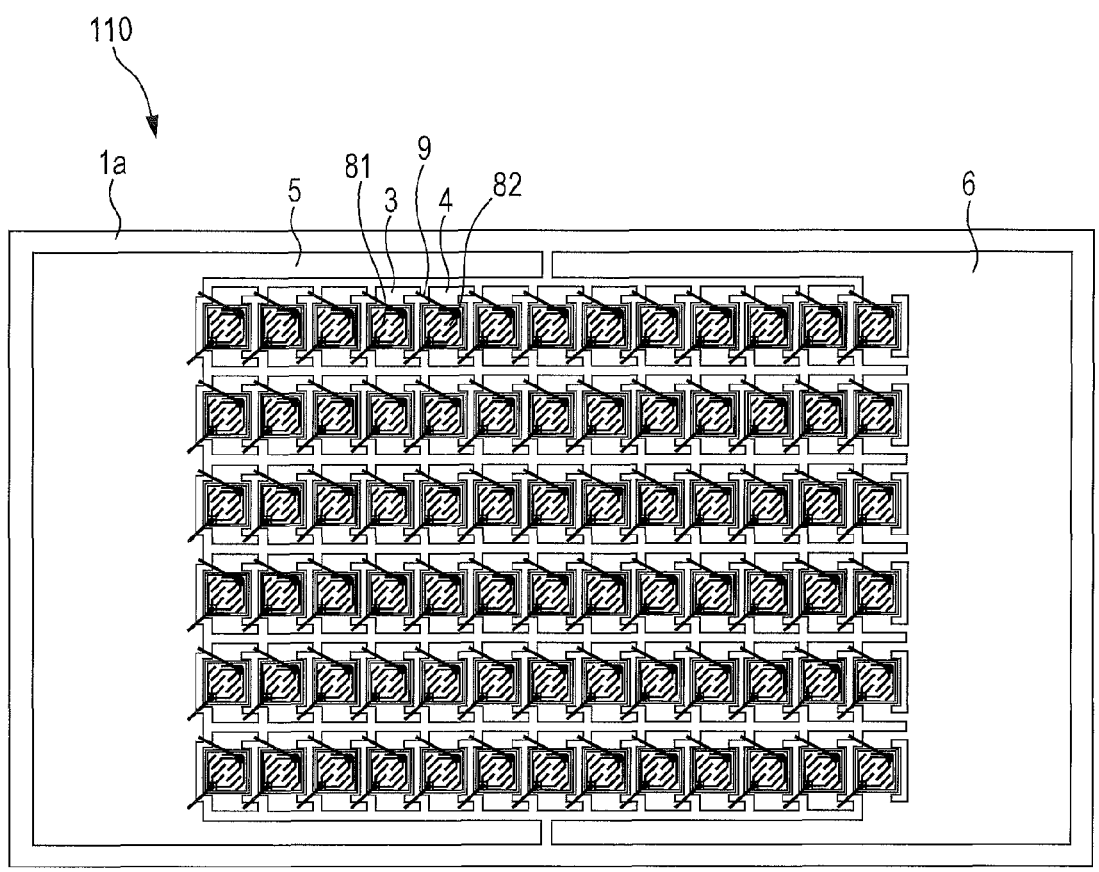
FIG. 4 is a top view schematically showing a light emitting device according to one embodiment of the present invention.

FIG. 4 shows a light emitting device 110 in a second embodiment of the present invention.

As shown in FIG. 4, although the configuration of conductive patterns 3 and 4 and the like is similar to that in the first embodiment, a plurality of arrays, each including a plurality of light emitting elements including a first light emitting element 81 and a second light emitting element 82, are arranged.

The plurality of arrays, each including the plurality of light emitting elements, are arranged, thus achieving a light emitting device having a high light output and a large light emitting area.

Figure 5:
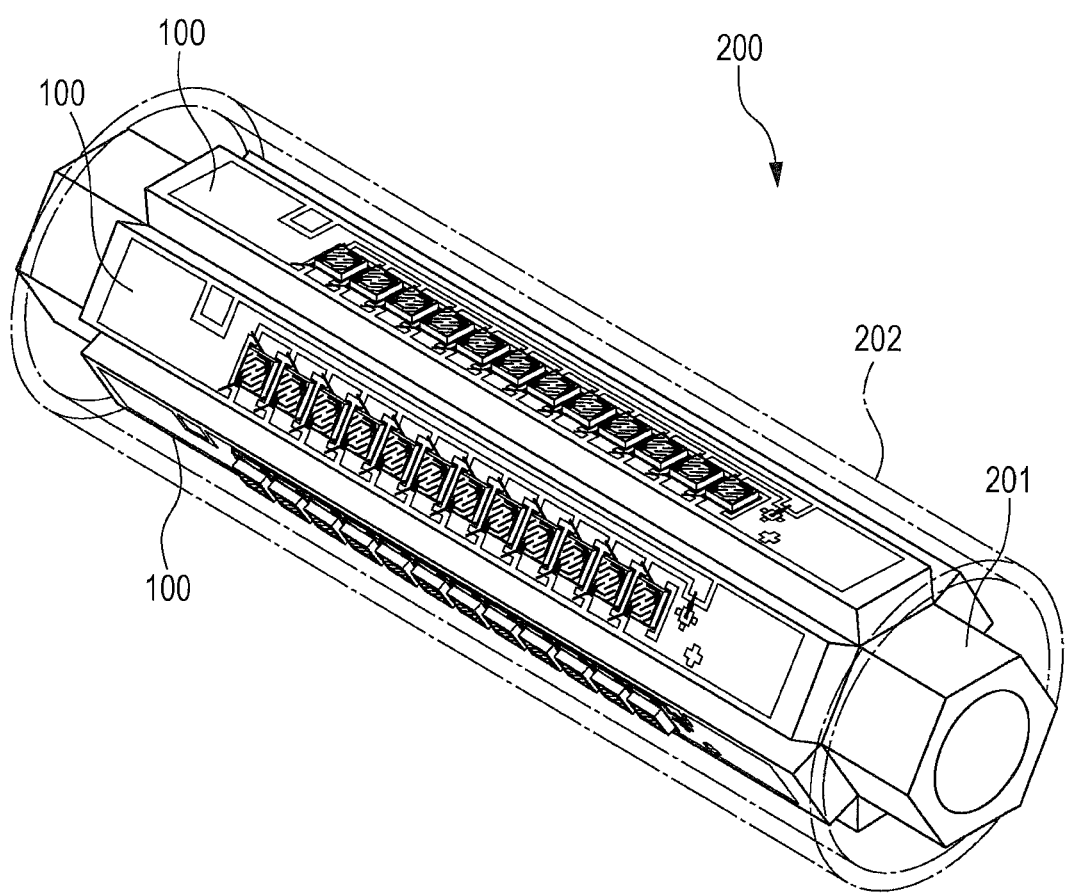
FIG. 5 shows a light source device using a light emitting device according to one embodiment of the present invention.

The light emitting device in the embodiment of the present invention can be used as various light sources. For example, as shown in FIG. 5, the six light emitting devices 100 in the first embodiment are arranged around a cylindrical shaft 201, thereby achieving a light source device for emitting light at an angle of 360° around the shaft 201. The light emitting devices for emitting ultraviolet light are arranged in the above-described manner, thus achieving a light source device 200 for light emission similar to a light emission from a conventional mercury-vapor lamp. Here, the light source device in the present embodiment has a cylindrical light transmissive cover 202 that covers the six light emitting devices and transmits, for example, 70% or more of the light beams emitted from the light emitting devices 100.

Figure 6:
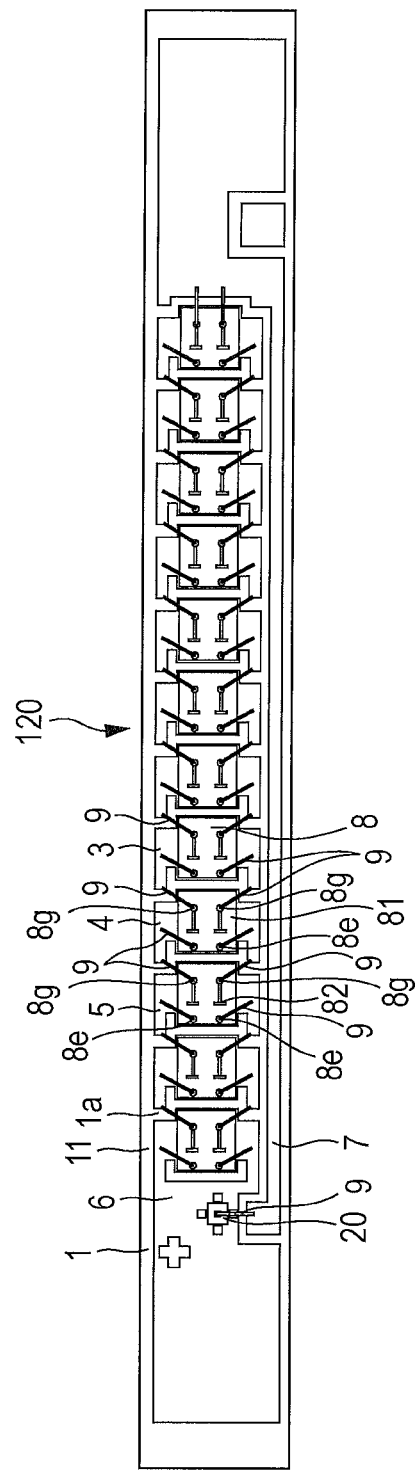
FIG. 6 is a top view schematically showing a light emitting device according to one embodiment of the present invention.

FIG. 6 shows a light emitting device 120 in a third embodiment of the present invention. As shown in FIG. 6, although the configuration of conductive patterns and a substrate of the light emitting device in the present embodiment is similar to that in the first embodiment, the structure of each of a plurality of light emitting elements, each of which includes a first light emitting element 81 and a second light emitting element 82, is different from that in the first embodiment.

The light emitting element in the present embodiment has insulating sapphire as a support substrate at the bottom thereof, and is provided with a p-electrode 8g and an n-electrode 8e at one surface serving as a light emitting surface. The two p-electrodes 8g are disposed at the center of the light emitting element whereas the two n-electrodes 8e are disposed at the ends of the light emitting element. The two p-electrodes 8g are connected to wire connecting portions of a conductive pattern adjacent to another conductive pattern having the light emitting element mounted thereon via wires 9, respectively. The two n-electrodes 8e are connected to wire connecting portions of a wiring pattern having the light emitting element mounted thereon via wires 9, respectively.

Incidentally, in the case where sapphire is used as the support substrate and a solder is used as a bonding member, it is preferable that a metal film is formed on the sapphire so as to enhance wettability between the light emitting element and the bonding member.

The embodiments of the present invention are described above. It is to be understood that the descriptions and drawings forming a part of this disclosure should not restrict the present invention. From this disclosure, various alternative embodiments, examples, and operating techniques will be obvious to one skilled in the art. The present invention is not limited to the above-described embodiments, and therefore, can be variously changed.

Although the two wire connecting portions formed at one conductive pattern have the same length in the above-described embodiments, they may have different lengths that can be appropriately set. In addition, the first wire connecting portion is allowed to extend greatly so as to be closer to the electrode of the second light emitting element, so that the length of the wire can be shortened, thus enhancing the reliability.

Although all of the light emitting elements disposed at one light emitting device have the same structure, and therefore, have the same size and the same upper shape in the above-described embodiments, they are not limited to this. Light emitting elements each having different structures, sizes, shapes, shapes of the electrode, positions, and light emitting wavelengths and various characteristics may be appropriately used.

Moreover, the amount of projection of the projecting portion at the element mounted portion may be appropriately set. However, the conductive pattern on which the light emitting element is to be mounted, in particular, the portion formed in the vicinity of the light emitting element also reflects the light emitted from the light emitting element, and thus functions to enhance the efficiency of the light emitting device. Therefore, if the amount of the projection is increased, that is, the area of the conductive pattern around the light emitting element is reduced, there may be a decrease in light extracting efficiency. Consequently, like the first embodiment, it is preferable that, for example, the end of the second element mounting portion 4a is substantially flush with the end of the first wire connecting portion 3b.

Additionally, the number of pads of the upper electrode of the light emitting element is not limited to two, one or three or more pads may be disposed. Moreover, one or three or more wires may be disposed in a manner corresponding to the number of pads.

A light emitting device according to one embodiment of the present invention includes: a first light emitting element; a second light emitting element disposed adjacent to the first light emitting element; a first conductive pattern provided with a first element mounting portion that is formed on a substrate and has the first light emitting element mounted thereon and a first wire connecting portion connected to a wire to be connected to the second light emitting element; and a second conductive pattern provided with a second element mounting portion that is separated from the first conductive pattern while holding a first wiring gap therebetween and mounts the second light emitting element thereon, wherein the outer shape of the first element mounting portion is defined by the first wiring gap and a first recess that is formed between the first element mounting portion and the first wire connecting portion, is continuous to the first wiring gap, and is formed on each of both sides of the first element mounting portion on a side near the second conductive pattern and wherein the first wire connecting portion extends toward the second conductive pattern beyond the first element mounting portion.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a substrate;
   a first light emitting element provided on the substrate;
   a second light emitting element provided on the substrate such that the first light emitting element and the second light emitting element are arranged along a first direction;
   a first conductive pattern provided on the substrate and comprising:
      a first element mounting portion on which the first light emitting element is mounted;
      a first sub-connecting portion to which a first wire connected to the second light emitting element is connected, the first sub-connecting portion being provided on a first side of the first element mounting portion;
      a second sub-connecting portion to which a second wire connected to the second light emitting element is connected, the second sub-connecting portion being provided on a second side of the first element mounting portion opposite to the first side; and
      the first sub-connecting portion and the second sub-connecting portion connected to the first element mounting portion; and
   a second conductive pattern provided on the substrate to form a first wiring gap between the first conductive pattern and the second conductive pattern, the second conductive pattern including a second element mounting portion on which the second light emitting element is mounted, a first sub-recess being provided between the first element mounting portion and the first sub-connecting portion along a second direction substantially perpendicular to the first direction and being in communication with the first wiring gap, the first sub-recess being provided on the first side of the first element mounting portion, a second sub-recess being provided between the first element mounting portion and the second sub-connecting portion along the second direction and being in communication with the first wiring gap, the second sub-recess being provided on the second side of the first element mounting portion, at least a part of an outer shape of the first element mounting portion being defined by the first wiring gap, the first sub-recess, and the second sub-recess on a third side of the first element mounting portion adjacent to the second conductive pattern, the first sub-connecting portion and the second sub-connecting portion projecting toward the second conductive pattern beyond an edge of the first element mounting portion.

2. The light emitting device according to claim 1, wherein the second conductive pattern further includes a third sub-connecting portion and a fourth sub-connecting portion, and
   wherein the second element mounting portion further projects toward the first conductive pattern beyond the third sub-connecting portion and the fourth sub-connecting portion.

3. The light emitting device according to claim 2, further comprising:
   a third conductive pattern which is provided on the substrate on a fourth side of the second conductive pattern, the fourth side being opposite to the first wiring gap, to form a second wiring gap between the second conductive pattern and the third conductive pattern and on which a third light emitting element is mounted,
   wherein the third sub-connecting portion is provided on a fifth side of the second element mounting portion,
   wherein the fourth sub-connecting portion is provided on a sixth side of the second element mounting portion opposite to the fifth side,
   wherein a third sub-recess is provided on the fifth side of the second element mounting portion,
   wherein a fourth sub-recess is provided on the sixth side of the second element mounting portion,
   wherein the third sub-recess is provided between the second element mounting portion and the third sub-connecting portion and is in communication with the second wiring gap, and
   wherein the fourth sub-recess is provided between the second element mounting portion and the fourth sub-connecting portion and is in communication with the second wiring gap,
   and
   wherein at least a part of an outer shape of the second element mounting portion is defined by the second wiring gap, the third sub-recess, and the fourth sub-recess on a seventh side of the second element mounting portion adjacent to the third conductive pattern.

4. The light emitting device according to claim 3, wherein an end of the second element mounting portion is flush with an end of the first sub-connecting portion and an end of the second sub-connecting portion.

5. The light emitting device according to claim 3, wherein the third sub-recess is provided between the second element mounting portion and the third sub-connecting portion connected to the second element mounting portion.

6. The light emitting device according to claim 3,
wherein the first light emitting element and the second light emitting element emit light beams from an ultraviolet region.

7. The light emitting device according to claim 3,
wherein the second element mounting portion further includes two projecting portions,
wherein one of the two projecting portions projects in a first projecting direction toward the second wiring gap, and
wherein another one of the two projecting portions projects in a direction opposite to the first projecting direction.

8. A light source comprising more than one of the light emitting device of claim 3.

9. The light emitting device according to claim 1,
wherein the first light emitting element and the second light emitting element emit light beams from an ultraviolet region.

10. A light source comprising more than one of the light emitting device of claim 9.

11. The light emitting device according to claim 1,
wherein the first element mounting portion further includes two projecting portions,
wherein one of the two projecting portions projects in the first direction toward the first wiring gap, and
wherein another one of the two projecting portions projects in a direction opposite to the first direction.

12. The light emitting device according to claim 1,
wherein an end of the second element mounting portion is flush with an end of the first sub-connecting portion and an end of the second sub-connecting portion.

13. The light emitting device according to claim 1, further comprising a plurality of arrays of light emitting elements,
wherein each of the plurality of arrays of light emitting elements includes elements identical to the first light emitting element and the second light emitting element.

14. The light emitting device according to claim 1,
wherein the first conductive pattern and the second conductive pattern include gold.

15. A light source comprising more than one of the light emitting device of claim 1.

* * * * *